United States Patent [19]

Naylor et al.

[11] Patent Number: 4,777,470
[45] Date of Patent: Oct. 11, 1988

[54] HIGH SPEED SUCCESSIVE APPROXIMATION REGISTER IN ANALOG-TO-DIGITAL CONVERTER

[75] Inventors: Jimmy R. Naylor; Joel M. Halbert; Wallace Burney, all of Tucson, Ariz.

[73] Assignee: Burr-Brown Corporation, Tucson, Ariz.

[21] Appl. No.: 101,760

[22] Filed: Sep. 28, 1987

[51] Int. Cl.$^4$ .............................................. H03M 1/46
[52] U.S. Cl. ........................................ 341/163; 377/54
[58] Field of Search ................ 340/347 AD; 377/33, 377/54, 64, 106, 115

[56] References Cited

U.S. PATENT DOCUMENTS

| | | | |
|---|---|---|---|
| 4,198,622 | 4/1980 | Connolly, Jr. et al. | 340/347 |
| 4,293,848 | 10/1981 | Cheng et al. | 340/347 |
| 4,366,470 | 12/1982 | Takanashi | 340/347 AD |
| 4,427,973 | 1/1984 | Brokaw et al. | 340/347 |
| 4,535,257 | 8/1985 | Hareyama | 340/347 AD |
| 4,593,270 | 6/1986 | White | 340/347 AD |
| 4,618,848 | 10/1986 | Parfitt | 340/347 |
| 4,620,179 | 10/1986 | Cooper et al. | 340/347 |
| 4,679,028 | 7/1987 | Wilson et al. | 340/347 |

Primary Examiner—Charles D. Miller
Attorney, Agent, or Firm—Cahill, Sutton & Thomas

[57] ABSTRACT

In a successive approximation analogs-to-digital converter, a successive approximation register (SAR) includes an N bit, edge triggered shift register, each bit including a master-slave flip-flop. The output of each shift register bit is applied to a latch input of a D-type latch and to one input of a two-input gate that performs a logical ANDing function. Another input of the gate is connected to an output of the latch. The D input of each of the N latches is connected to an output of a corresponding comparator, which compares an analog input signal to a signal produced by an N bit digital-to-analog converter (DAC) in response to successive approximation numbers produced by the SAR. The gate outputs are connected to digital inputs of the DAC. A "0" propagates through the shift register at the DAC conversion rate. Beginning with the most significant bit (MSB), each successive digital approximation number applied to the DAC consists of a "1" gated to the DAC by the shift register bit presently containing the propagating "0". After the present digital approximation number has been compared (by a comparator) to the analog input current, the resulting comparator data is latched into the data latch as the "0" shifts to the next bit. When the procedure has been completed for all N bits, the N bit word stored in the N data latches accurately represents the analog input current.

13 Claims, 3 Drawing Sheets

HIGH SPEED SUCCESSIVE APPROXIMATION REGISTER IN ANALOG-TO-DIGITAL CONVERTER

BACKGROUND OF THE INVENTION

The invention relates to analog-to-digital converters of the successive approximation type, and more specifically to an improved successive approximation register that operates at very high speeds with no race conditions.

There is a continuing, increasing need for high speed, low cost analog-to-digital converters to receive analog signals from various transducers and the like, for the purpose of rapidly converting the analog signals to digital numbers that can be input to a digital computer. The stat-of-the-art is generally indicated by the Am2502/3/4 successive approximation registers, manufactured by Advanced Micro Devices and others. These successive approximation registers are TTL high speed special purpose registers that contain all of the storage and digital control circuitry for an 8 or 12 bit analog-to-digital converter of the successive approximation type. Successive approximation analog-to-digital converters operate by comparing an unknown analog input with a time-dependent feedback voltage derived from a digital-to-analog converter. The conversion process is performed by generating N successive approximation numbers one bit at a time, beginning with the most significant bit.

FIG. 1 shows a basic block diagram of a successive approximation analog-to-digital converter. An analog input voltage $V_{IN}$ is applied to analog input terminal 1. The analog-to-digital converter 2 converts $V_{IN}$ into a digital representation of $V_{IN}$ by applying $V_{IN}$ across a resistor R. The other terminal of resistor R is connected by conductor 3 to the inverting input of comparator 5 and to the output of an N bit digital-to-analog converter 4. The non-inverting input of comparator 5 is connected to a ground reference voltage, so conductor 3 in effect functions as a "virtual ground" during the successive approximation procedure. A current $I_{IN}$ thus flows through resistor R. The digital-to-analog converter 4 produces an output current $I_{DAC}$ corresponding to the digital approximation number being applied to its N digital inputs on N conductors 8. The output of comparator 5 is connected by comparator data conductor 6 to an input of a successive approximation register (SAR) 7. For the first iteration of the method, the most significant bit produced by the successive approximation register 7 is output as a "0", with the remaining bits being "1's". The successive approximation register 7 then contains the first approximation number or "trial" binary number, which lies in the center of the range of possible digital equivalents to $V_{IN}$. The first digital approximation number is apllied to the inputs of the digital-to-analog converter 4. A digital-to-analog conversion is made, and the resulting output current $I_{DAC}$ is effectively compared to $I_{IN}$ at node 3. If the input current $I_{IN}$ is larger than $I_{DAC}$, then the voltage on conductor 3 will be at a positive potential and comparator will 5 produce a "0" on data comparator output conductor 6, which indicates that the first bit of the digital number into which $V_{IN}$ is to be converted is to be a "0". Otherwise, the first bit is to be a "1". Next, successive approximation register 7 produces a second digital approximation number in which the most significant bit is either a "0" or a "1", depending on the state of comparator output conductor 6, the second most significant bit is a "0", and the remaining bits are "1's". Then a third approximation number is produced in which the two most significant bits of the desired digital number are included. The procedure is repeated for the remaining N-2 bits, at which point the analog-to-digital conversion is complete, whereupon conductor 3 is at nearly zero volts.

The successive approximation register used in the above-mentioned Am2502 and related products can be utilized to implement successive approximation register 7 of FIG. 1. However, that successive approximation register has longer signal propagation delays than desirable in each bit. Furthermore, that successive approximation register is subject to internal signal "race" conditions, which necessitate building in larger then desirable safety margins to ensure proper operation under worst case conditions.

As the state-of-the-art has advanced, a clear need has arisen for a faster, less "delay-sensitive" successive approximation register than previously has been available in order to meet the goal of providing an inexpensive, high speed, high resolution (i.e., 12 bits) analog-to-digital converter.

SUMMARY OF THE INVENTION

Accordingly, it is an object of the invention to provide an improved successive approximation analog-to-digital converter capable of operating without internal race conditions and at highter speed than the closer prior art devices.

It is another object of the invention to provide a high speed, low cost successive approximation register.

Briefly described, and in accordance with one embodiment, the invention provides an analog-to-digital converter including a successive approximation register (SAR) that includes a plurality of data latches, a plurality of shift register bit circuits each including a master-slave, edge triggered flip-flop, and a plurality of gates that perform logical ANDing functions. An input of each respective gate circuit is connected to an output of a corresponding data latch. Another input of each gate is connected to an output of a corresponding shaft register bit. The latch input of each data latch also is connected to the output of a corresponding shift register bit. In operation, both the shift register bits and the data latch bits are preset to initial values. A logical "0" propagates through the shift register at the same rate that successive approximation numbers are produced by the successive approximation register. The propagating "0" disables the gates to successively output a logical "0" for each bit applied to a digital-to-analog converter in the successive approximation analog-to-digital converter. Comparator data produced by comparison of the analog input signal to the analog signal produced by the digital-to-analog converter in response to the present successive approximation number then is latched into the data latch having its latch input connected to the shift register bit that presently contains the propagating "0". (This latching occurs when the propagating "0" returns to a "1" level. The latches are "transparent" (i.e., Q=D) when their latch inputs L are at logical "0's", and are latched or "non-transparent" when their latch inputs L are at logical "1's". The described circuit has no connections from the output of any bit cell to the input of any other bit cell; that is, there is no feed forward or feedback from one bit cell to another bit cell as in other SAR circuits. This configuration thereby avoids internal race conditions. A CMOS implementation is disclosed which provides minimum propagation delays through the data latches and associated gating circuitry, allowing high speed, race-free operation.

DETAILED DESCRIPTION OF THE PREFERRED EMBODIMENTS

Figure 1:
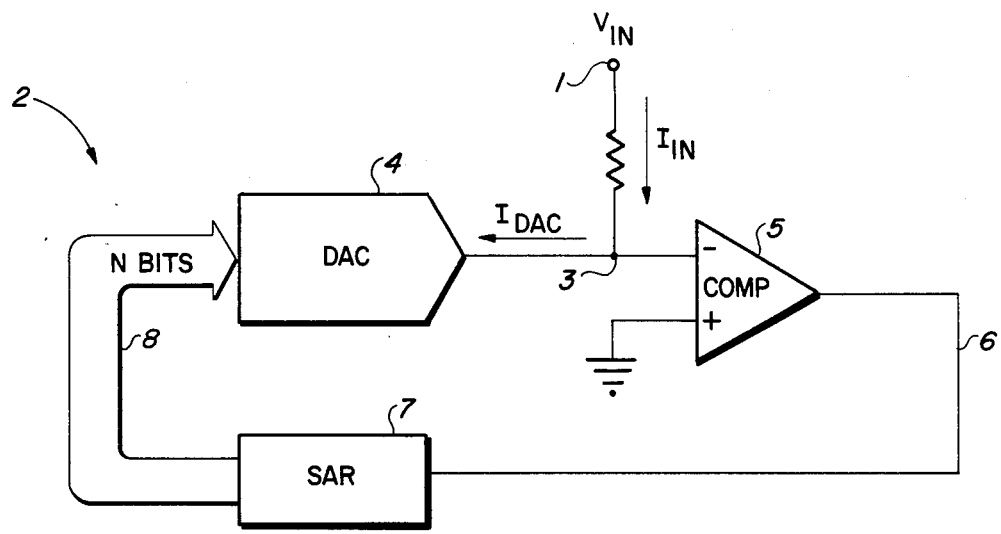
FIG. 1 is a basic block diagram of a successive approximation analog-to-digital converter in which the successive approximation register of the present invention can be utilized.
Figure 2B:
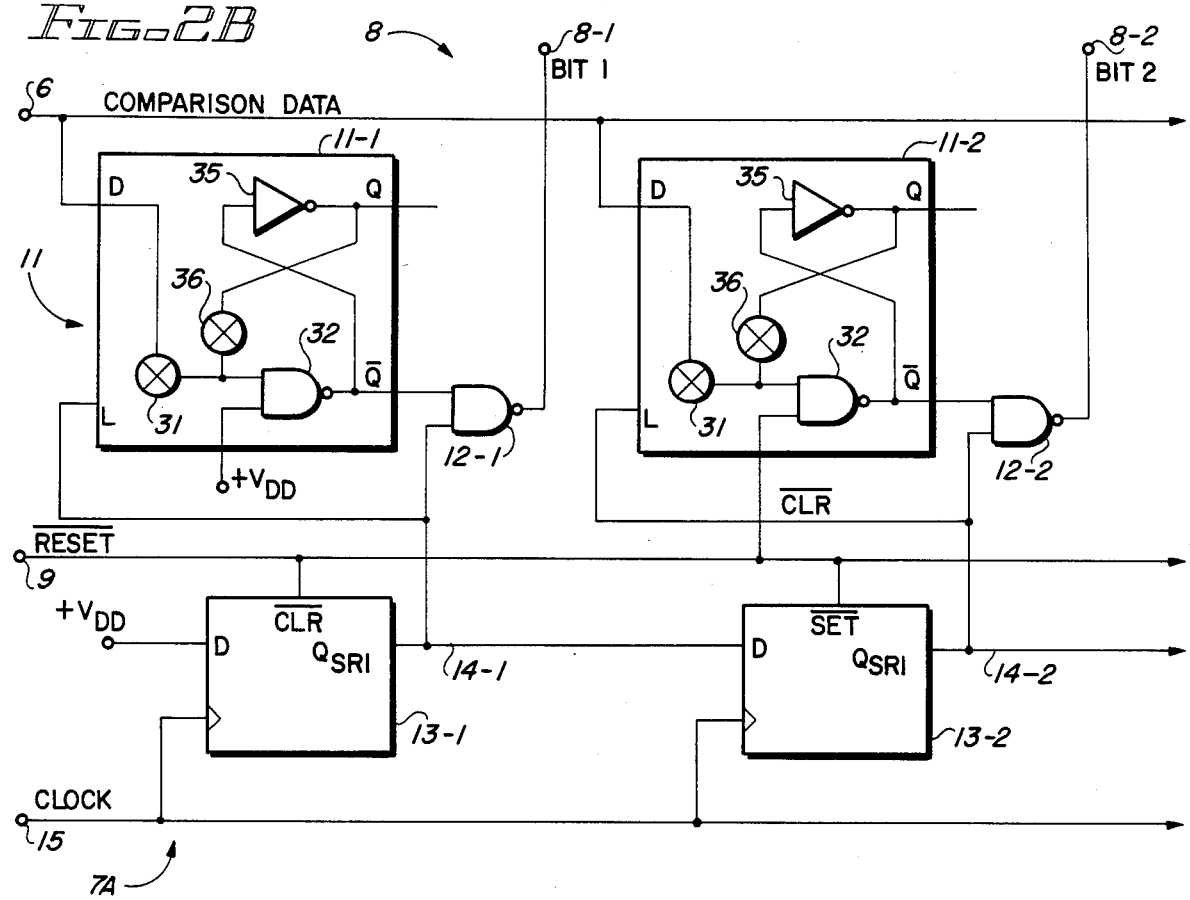
FIG. 2B is a block diagram of an alternate successive approximation register of the invention with minimum gate delays.
Figure 2A:
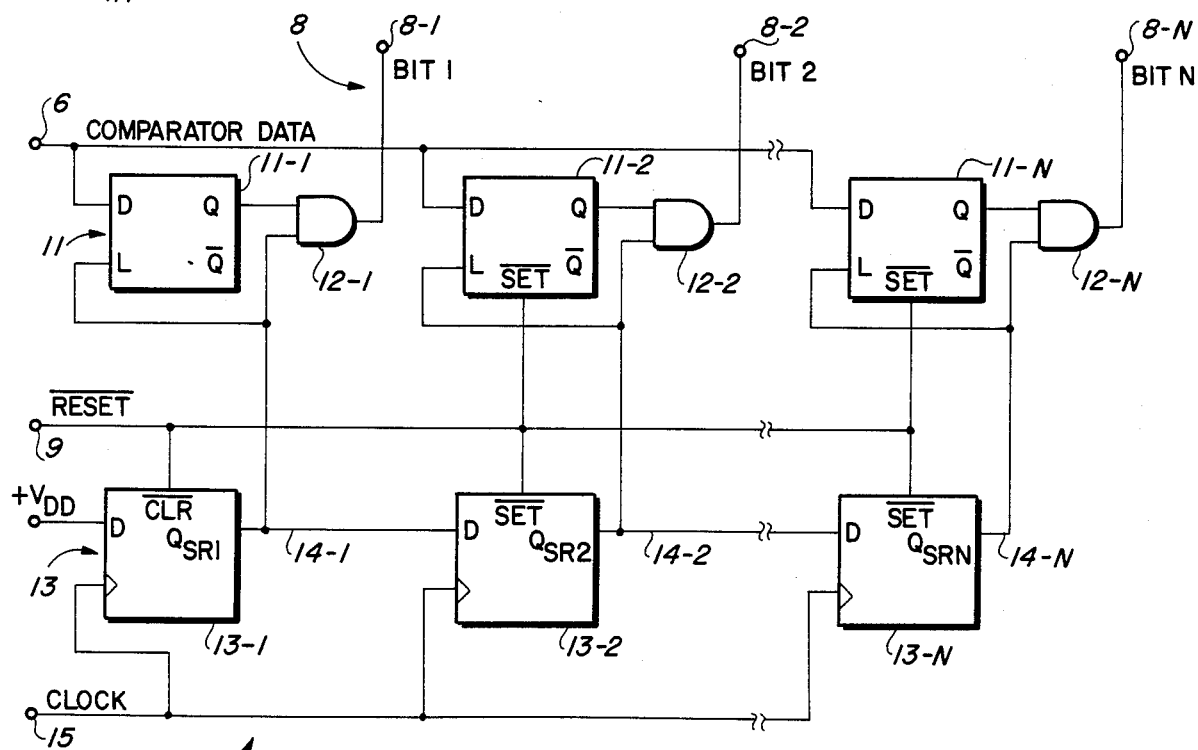
FIG. 2A is a simplified block diagram of a successive approximation register of the present invention.

Referring to FIG. 2A, successive approximation register (SAR) 7 of the present invention can be utilized in the SAR 7 of the analog-to-digital converter of FIG. 1. SAR 7 includes N outputs 8-1, 8-2, ... 8-N, each of which is connected to the output of an AND gate 12-1, 12-2, ... 12-N, respectively. Each AND gate can be implemented by connecting the output of a NAND gate to the input of an inverter.

Each of the AND gates, collectively designated by reference numeral 12, has two inputs, one connected to the Q output of a corresponding one of data latches 11-1, 11-2, ... 11-N, respectively. The data latches, collectively referred to by reference numeral 11, all are simple D-type latches. The D input of each data latches 11 is connected to comparator data conductor 6 of FIG. 1.

SAR 7 also includes N shift register bits 13-1, 13-2, ... 13-N, collectively referred to by reference numeral 13. Each of the shift register bits 13 is a master-slave, edge-triggered flip-flop. The clock input of each of the shift register bits 13 is connected to a clock conductor 15, which conducts a clock signal 15, shown in the timing diagram of Fig. 3. The shift register bits are triggered by the positive edge of clock signal 15. The D input of shift register bit 13-1 is connected to a logical "1" level, which in this case is $+V_{DD}$ volts. The Q output of shift register bit 13-1 is connected by conductor 14-1 to the L (latch) input of data latch 11-1 and to the other input of AND gate 12-1. Similarly, the Q output of shift register bit 13-2 is connected to the L input of data latch 11-2 and to the second input of AND gate 12-2, and the Q output of the remaining shift register bits 13 are similarly connected, as shown in FIG. 2. The set (SET*) inputs of data latches 11-2, ... 11-N and the "set" (SET*) inputs of shift register bits 13-2, ... 13-N are connected to a reset conductor 9, which conducts a signal RESET, shown in the timing diagram of FIG. 3. (Asterisks represent logical complement signals, since the printer being used has no overstrike capability.) The "clear" (CLR*) input of shift register 13-1 is connected to reset (RESET*) conductor 9.

The initial step in the operation of SAR 7 is to write "1's" into bits 13-2 to 13-N of the shift register, a "0" into bit 13-1 of the shift register, and "1's" into bits 11-2, ... 11-N of the data latch 11 in response to reset signal 9 in FIG. 4.

The trailing edge of the RESET pulse occurs after the leading edge of the initial pulse of clock signal 15. Since the $Q_{SR1}$ output of shift register bit 13-1 then is a "0", that "0" (designated by pulse 14-1A of FIG. 3) applied to one input of AND gate 12-1 causes it to produce a "0" on bit 1 digital data conductor 8-1, as indicated by reference numeral 8-1A in FIG. 3. This causes the first approximation number to be 011 ... 1. During the interval between CLOCK pulses 15-1 and 15-2, DAC 4 converts the first approximation number 011 ... 1, producing an initial value of $I_{DAC}$ which is compared with $I_{IN}$. If $I_{IN}$ exceeds $I_{DAC}$, the comparator data signal on conductor 6 is a "0", otherwise it is a "1".

Next, when clock pulse 15-2 occurs, its leading edge causes the "0" on conductor 14-1 to be clocked into shift register bit 13-2, which now produces a logical "0", designated by pulse 14-2A in FIG. 4, to appear on conductor 14-2.

The D input of shift register bit 13-1 is connected to $+V_{DD}$. This causes conductor 14-1 to switch to a "1", as indicated by level 14-1B in FIG. 3. This latches the COMPARATOR DATA level on conductor 6 into data latch 11-1, and gates that level through AND gate 12-1, correspondingly producing either a "1" or "0" on conductor 8-1. I.e., conductor 8-1 will have the logic level designated by 8-1B if the COMPARATOR DATA signal 6 is a "1", and will have the level 8-1C in FIG. 3 if the COMPARATOR DATA level 6 is a "0". For the rest of the conversion process, either level 8-1B or 8-1C will remain latched in data latch 11-1 and will continue to be gated onto most significant bit conductor 8-1.

Figure 3:
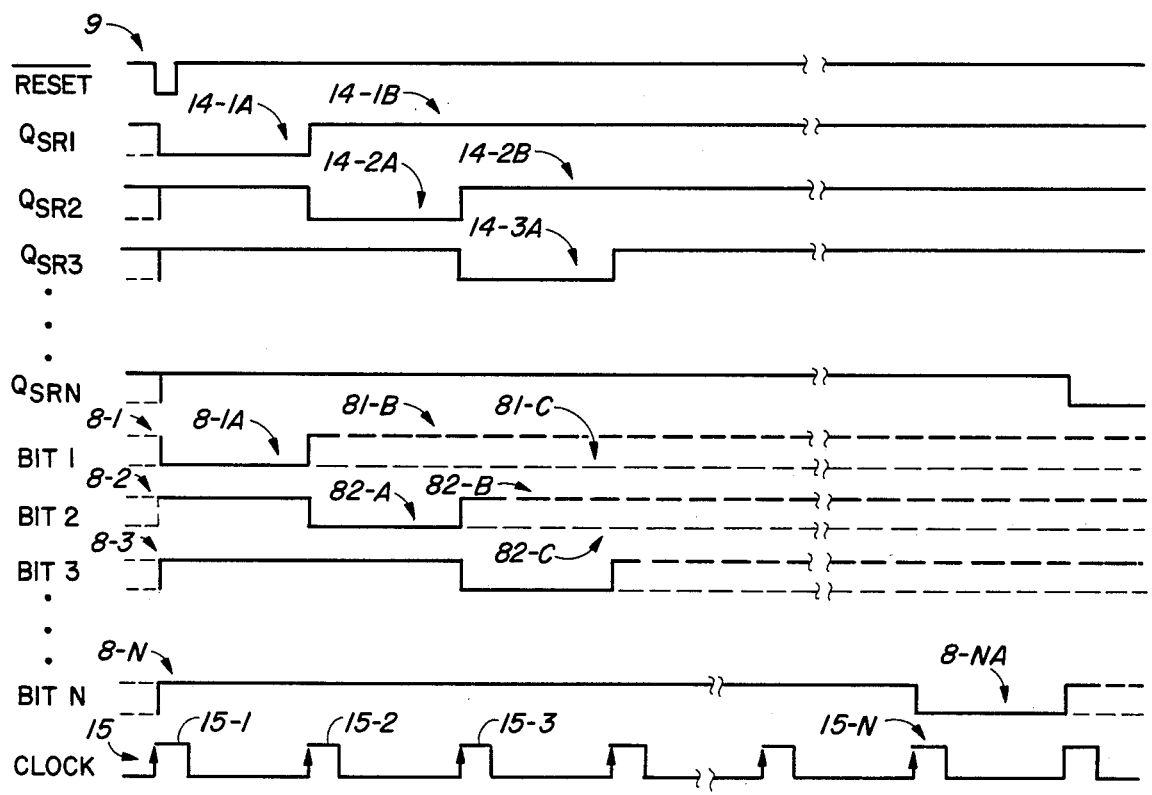
FIG. 3 is a detailed timing diagram of the successive appromimation register of FIG. 2A.

The "0" pulse 14-2A on conductor 14-2 forces the output of AND gate 12-1 to produce a "0" on conductor 8-2, as indicated by pulse 8-2A in FIG. 3. During that pulse, the new successive approximation number X0111 ... 1 (X being the comparator data level latched into latch 11-1) is being converted by DAC 4, producing new value of $I_{DAAC}$, which then is compared with $I_{IN}$. At this point, the most significant bit of an N bit digital approximation to $V_{IN}$ has been obtained within an accuracy of 50%. When clock pulse 15-3 occurs, conductor 14-2 returns to a "1" level, as indicated by 14-2B, and conductor 14-3 goes to a "0", as indicated by pulse 14-3A in FIG. 3. The rising of conductor 14-2 to a "1" level latches the comparator data signal on conductor 6, which indicates whether the second most significant bit 8-2 is a "0" or "1", depending upon wheter $I_{DAC}$ is less than or greater than $I_{IN}$ and latches that state into latch 11-2. Latch 11-2 will contain either the level indicated by reference numeral 8-2B or 8-2C for the rest of the successive approximation operation.

The foregoing procedure is repeated until the "0" initially written into the most significant shift register bit 13-1 has propagated through all N shift register bits, producing N successive approximation numbers resulting in storing of a successively more accurate digital representation of $V_{IN}$ in the more significant data latches 11. If desired, an N+1 shift register bit (not shown) can be provided to generate a signal that indicates whether the analog-to-digital converter 2 is "busy", i.e. the successive approximation procedure has been completed and the analog-to-digital converter 2 is "ready".

The advantages of the above-described successive approximation register structure are that a small number of gate delays are required to latch the comparator data signal 6 into one of data latches 11 and output the next successive approximation number. No possible signal race conditions exist, because there is no feedback and/or feed forward from the latch and/or gating circuitry of one bit cell to that of the next or previous bit cell, so the circuit is capable of very high speed operation without worst case design to avoid occurrence of race conditions.

FIG. 2B shows a more detailed implementation of a successive approximation register, designated by numeral 7A, wherein each of the latches 11-1, 11-2, etc. includes a CMOS transmission gate 31 coupling the D input, i.e., the comparator data conductor 6, to one input of a two input NAND gate 32. The other input of NAND gate 32 is connected to $+V_{DD}$ for latch 11-1, and is connected to reset conductor 9 for latches 11-2 through 11-N. The output of each NAND gate 32 is connected to the Q* output of the latch and to the input of a CMOS inverter 35. The output of CMOS inverter 35 is connected to the Q output of the latch and also is connected by a CMOS transmission gate 36 to the first input of CMOS NAND gate 32. This embodiment of the invention initially sets "0's" in shift register bit 13-1 and in latch bits 11-2 through 11-N (so the Q* outputs of latch bits 11-2 through 11-N produce "1's"), and sets "1's" in shift register bits 13-2 through 13-N. As in the embodiment of FIG. 2A, a "0" is shifted through shift register 13. For each of the output bits 8-1, 8-2 ... 8-N, a "1" corresponds to a DAC bit being on, and a "0" corresponds to a DAC bit being off. The sequence of successive appromximation numbers output by the SAR 7A of FIG. 2B is thus 100 ... 0, X10 ... 0, XX10 ... 0, ... XX ... X1, and XX ... XX, wherein the X's designate comparator data states latched into the successively less significant latches 11-1, 11-2, ... 11-N. If it is desirable to change the polarity of the successive approximation numbers, an inverter can be connected between the outputs of the NAND gates 12--1, etc. and the output conductors 8-1. This assumes that all input logic levels for the DAC have the same relationship to their corresponding bit currents, i.e., a "1" turns a corresponding bit current on. However, it is possible to provide a DAC in which some bit currents respond to different corresponding input levels than others, i.e., "1's" turn on some bit currents, and "0's" turn on others. In this case, the successive approximation numbers would have to be changed accordingly by inverting logic levels for the inverted DAC bits.

The structure shown in FIG. 2B has the advantage that only two gate delays, namely through gate 32 and gate 12-1, etc. is required to latch the comparator data on conductor 6 to the output conductor 8-1, etc.

Figure 4A:
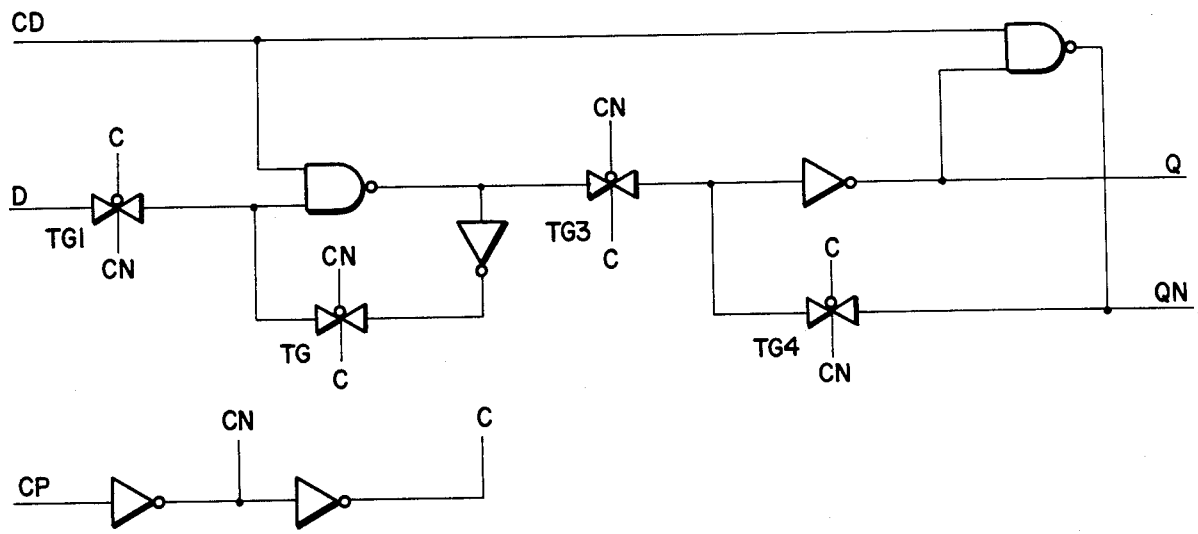
FIGS. 4A and 4B include a detailed logic diagram of a CMOS implementation of the shift register bit circuits.
Figure 4B:
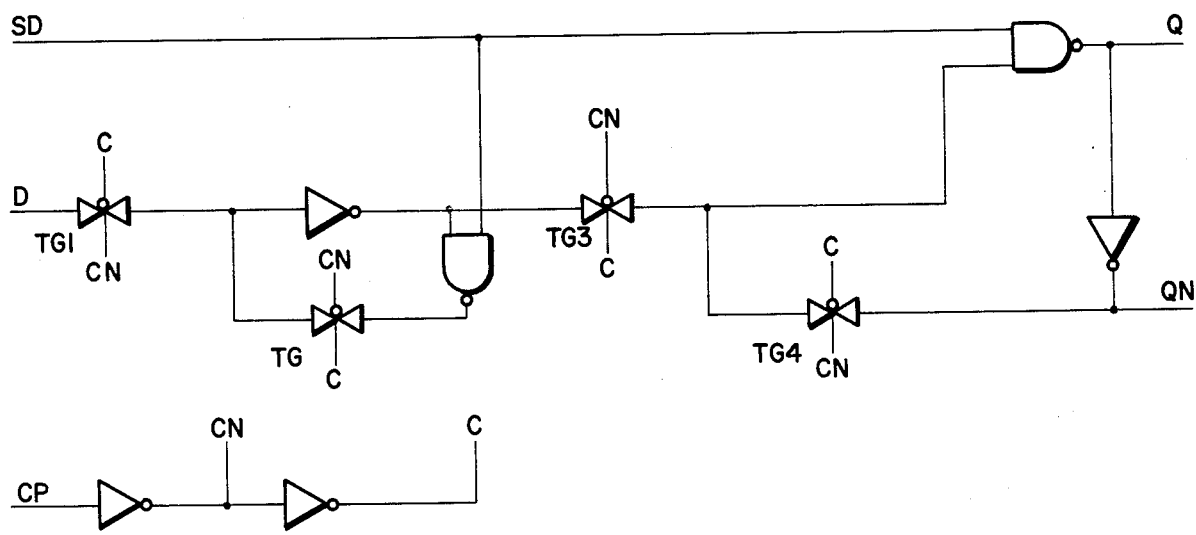

FIG. 4A shows a practical CMOS implementation of shift register bit 13-1. FIG. 4B shows a practical implementation of shift register bits 14-2 through 14-N. These cells are designated by standard cell library designations FD2L and FD4, respectively in the Innovative Silicon Technology Standard Cell Library.

While the invention has been described with reference to a particular embodiment thereof, those skilled in the art will be able to make various modifications to the described embodiment of the invention without departing from the true spirit and scope thereof. It is intended that all elements and steps which perform substantially the same function in substantially the same manner to achieve the same result are within the scope of the invention. The term "logical ANDing", of course, encompasses any connection of a NAND, AND, NOR, or OR gate in which one input functions to enable or gate another input to the output. In both FIGS. 2A and 2B either the Q or the Q* output of each latch can be connected to an input of the ANDing gate, depending on the logical level definitions required for the inputs of the DAC being used. Also, the inverting and non-inverting inputs of the comparator can be reversed to provide the proper polarity of the comparator output for the particular arrangement of AND, NAND, OR, NOR gating function and "type of approximation" being used. In general, any or all logical elements can be changed to operate with positive-true or negative-true logic, or with transmission-gate logic, or with "wired-on" connected logic without changing the fundamental nature of the invention.

By "type of approximation", what is meant is that the decision whether to latch a "1" or "0" into a particular bit of latch 11 can be made on the basis of either the value of that bit in the present successive approximation number (for one type of approximation) or the value of the sum of the less significant bits of the present (different) successive approximation number (for another type of approximation). For example, in the type of approximation described earlier, the successive approximation number turns on the most significant bit current, which is compared to the input current $I_{IN}$ to determine whether to leave that bit current on or turn it off. In another possible type of approximation, the successive approximation number turns on the output currents corresponding to bits 2 through N, the sum of which is compared to $I_{IN}$ to determine whether to leave the MSB bit current off or turn it on.

We claim:

1. An N-bit successive approximation register comprising in combination:
   (a) an N-bit latch including N latch bit circuits each having an output, a latching input, and a data input coupled to a comparison data conductor conducting a signal indicative of whether a prior successive approximation number is too high or too low;
   (b) N gating means each having a first input coupled to an output of a respective latch bit circuit, a second input, and an output for producing a bit of an N-bit successive approximation number;
   (c) an N-bit shift register including N shift register bit circuits, each having an output coupled to the second input of a respective gating means and a latching input of a respective latch bit circuit, and a shift input coupled to a clock conductor; and
   (d) means for writing a first logic level into a most significant one of the shift register bit circuits, a second logic level opposite to the first into the remaining shift register bits circuits, the outputs of the N gating means sequentially producing N N-bit successive approximation numbers as the first logic level is shifted through the shift register bit circuits in response to certain edges of a clock signal on the clock conductor.

2. A successive approximation method for converting an analog signal to a digital signal, the method comprising the steps of:
   (a) providing
      i. an MSB latch and a plurality of latches,
      ii. an MSB shift register bit and a plurality of shift register bits, iii. a plurality of gates each having an output coupled to a respective input of a digital-to-analog converter;

(b) storing a first logic level in each of the latches, a second logic level in each of the shift register bits, and storing a third logic level in the MSB shift register bits, the third logic level being opposite to the second logic level;

(c) operating one of the gates in response to the third logic level in the MSB shift register bit to produce a fourth logic level on the output of that gate, and operating the remaining gates in response to the second logic levels in the remaining shift register bits to produce a fifth logic level opposite to the fourth logic level on the outputs of those gates, respectively, to thereby produce a first digital approximation number on the outputs of the gates;

(d) operating the digital-to-analog converter to produce an output signal and comparing the output signal to an input signal representative of the analog signal, and producing a comparison signal indicative of whether the output signal is greater or less than the input signal;

(e) latching the level of the comparison signal into the MSB latch and shifting the third logic level in the MSB shift register bit to a next most significant shift register bit in response to a clock signal;

(f) operating another of the gates in response to the third logic level in the next most significant shift register bit to produce the fourth logic level on the output of that gate;

(g) repeating step (d);

(h) latching the level of the comparison signal into the next most significant latch and shifting the third logic level to a next most significant shift register bit in response to the clock signal; and (i) repeating steps (f)–(h) for all remaining shift register bits and latches in order of decreasing significance, to thereby provide in the MSB latch and the plurality of latches the digital signal as an accurate digital representation of the analog signal.

3. In an analog-to-digital converter, a successive approximation register comprising in combination:

(a) a plurality of data latches, including a most significant data latch, each having a data input coupled to a comparison data conductor, a latching input, and an output;

(b) a plurality of master-slave shift register bit circuits, including a first shift register bit circuit, each having a clock input coupled to a clock signal conductor and each having an output and a data input;

(c) a plurality of gating circuits each having a first input, and each also having a second input coupled to the output of a respective one of the data latches, and an output conducting a respective bit of a digital approximation number to an input of a digital-to-analog converter;

(d) a plurality of means for coupling the output of each shift register bit circuit to both the latching input of a corresponding data latch and the first input of a corresponding gating circuit, respectively; and (e) means for setting a first logical level in the first shift register bit circuit and a second logic level opposite to the first in the other shift register bit circuits, and means for setting a third logic level in all of the data latches except the first data latch, whereby the first level set in the first shift register bit circuit propagates through the other shift register bit circuits in response to the clock signal, causing the gating circuits to produce a plurality of binary successive approximation numbers by producing a fourth logic level having a preselected relationship to the third logic level on successively less significant inputs of the digital-to-analog converter, the transitions of the first logic level to the second logic level as the first logic level propagates causing latching of comparison data on the comparison data conductor into corresponding data latches.

4. An N-bit successive approximation register comprising in combination:

(a) an N-bit latch including N latch bit circuits each having an output, a latching input, and a data input coupled to a comparison data conductor conducting a signal indicative of whether a prior successive approximation number is too high or too low;

(b) N gating means each having a first input coupled to an output of a respective latch bit circuit, a second input, and an output for producing a bit of an N-bit successive approximation number;

(c) an N-bit shift register including N shift register bit circuits, each having an output coupled to the second input of a respective gating means and a latching input of a respective latch bit circuit, and a shift input coupled to a clock conductor; and (d) means for writing a first logic level into a most significant one of the shift register bit circuits, a second logic level opposite to the first into the remaining shift register bits circuits, and a third logic level into each of the latch bit circuits except a most significant one, the outputs of the N gating means sequentially producing N N-bit successive approximation numbers as the first logic level is shifted through the shift register bit circuits in response to certain edges of a clock signal on the clock conductor.

5. The N-bit successive approximation register of claim 4 wherein each of the shift register bit circuits includes a edgeclocked master-slave flip-flop and each latch bit circuit includes a single level latched single state flip-flop.

6. The N-bit successive approximation register of claim 4 wherein each of the gating means performs a logical ANDing function.

7. The N-bit successive approximation register of claim 6 wherein the third logic level is a "0", and a sequence of successive approximation numbers produced by the N-bit successive approximation register is 100 . . . 0, X10 . . . .0, . . . , X . . . X1, XX . . . X wherein the X's designate binary "1's" and "0's" representative of N successive levels of the signal on the comparison data signal conductor.

8. The N-bit successive approximation register of claim 6 wherein the third logic level is a "1", and a sequence of successive approximation numbers produced by the N-bit successive approximation register is 011 . . . 1, X01 . . . 1, X . . . X0, XX . . . X wherein the X's designate binary "1's" and "0's" representative of N successive levels of the signal on the comparison data signal conductor.

9. The N-bit successive approximation register of claim 6 wherein each gating means includes a two input AND gate.

10. The N-bit successive approximation register of claim 9 wherein the first input of each AND gate is coupled to the Q output of a corresponding latch bit circuit.

11. The N-bit successive approximation register of claim 6 wherein each gating means includes a two input NAND gate.

12. The N-bit successive approximation register of claim 11 wherein the first input of each NAND gate is coupled to a Q* output of a corresponding latch bit circuit.

13. The N-bit successive approximation register of claim 12 wherein each latch bit circuit except one corresponding to a most significant bit of the successive approximation register includes a first CMOS transmission gate coupled between the data input of that latch bit circuit and a first conductor thereof, a first CMOS NAND gate having a first input coupled to the first conductor, a second input coupled to the writing means and an output coupled to the Q* output of that latch bit circuit, a CMOS inverter having an output and also having an input coupled to the Q* output, and a second CMOS transmission gate coupled between the output of the CMOS inverter and the first conductor.

* * * * *